(12) United States Patent
Shu et al.

(10) Patent No.: US 7,257,880 B2
(45) Date of Patent: Aug. 21, 2007

(54) METHOD FOR ASSEMBLING AN ACTUATOR HEAD SUSPENSION

(75) Inventors: Toshihiro Shu, Kanagawa (JP); Hiroaki Uchiyama, Kanagawa (JP); Tadashi Nozawa, Kanagawa (JP); Katsushi Yamaguchi, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 191 days.

(21) Appl. No.: 11/064,705

(22) Filed: Feb. 23, 2005

(65) Prior Publication Data

US 2005/0188531 A1    Sep. 1, 2005

(30) Foreign Application Priority Data

Feb. 26, 2004    (JP) .............................. 2004-051846

(51) Int. Cl.
  *G11B 5/127*    (2006.01)
  *G11B 5/60*    (2006.01)
(52) U.S. Cl. ................ 29/603.03; 29/603.04; 29/846; 29/854; 29/857; 360/234.5
(58) Field of Classification Search ............. 29/603.03, 29/603.04, 854, 846, 857; 360/234.5, 234.9, 360/245.8, 246, 104; 428/65.3, 336, 694
See application file for complete search history.

(56) References Cited

U.S. PATENT DOCUMENTS 5,414,576 A * 5/1995 Ueki et al. ............... 360/245.9
5,976,660 A * 11/1999 Saito et al. ............... 428/842.8
6,169,643 B1 * 1/2001 Iwamoto .................. 360/245.9
6,249,404 B1 * 6/2001 Doundakov et al. ..... 360/245.4

FOREIGN PATENT DOCUMENTS

JP    2000-21157    1/2000

* cited by examiner

*Primary Examiner*—A. Dexter Tugbang
*Assistant Examiner*—Tai Van Nguyen
(74) *Attorney, Agent, or Firm*—Townsend and Townsend and Crew LLP; Duke Amaniampong (57) ABSTRACT

Embodiments of the invention provide a method for easily and reliably neutralizing charge in an assembly process for an actuator head suspension assembly used in a magnetic disk device. In one embodiment, a head suspension assembly includes a wire trace that includes a laminated structure of a metal layer, a first dielectric layer, a conductor layer, and a second dielectric layer. The conductor layer includes an exposed portion exposed from the second dielectric layer. The suspension assembly also includes a head/slider supported by the metal layer. An actuator assembly includes an actuator arm and a flexible printed circuit board. The exposed portion of the conductor layer is immersed in a charge neutralizing solvent. The head suspension assembly is mounted to the actuator arm. A terminal of the wire trace is connected to a terminal of the flexible printed circuit board.

20 Claims, 9 Drawing Sheets

|  | A-7 | A-11 | AP-1 | AP-7 | H-11 | HP-1 | HP-7 |
|---|---|---|---|---|---|---|---|
| Ethanol | 85.5±1.0 | 85.5±1.0 | 85.5±1.0 | 85.5±1.0 | 79.3±1.0 | 79.3±1.0 | 79.3±1.0 |
| Methanol | Less than 5.0 | 13.4±0.5 | 1.1±0.2 |  | 13.3±0.5 | 1.1±0.2 |  |
| I.P.A |  | 1.1±0.2 | 13.4±0.5 | Less than 5.0 | 1.1±0.2 | 13.3±0.5 | Less than 5.0 |
| N.P.A | 9.6±0.5 |  |  | 9.6±0.5 |  |  | 9.5±0.5 |
| Water content | 0.2 max | 0.2 max | 0.2 max | 0.2 max | 6.3 max | 6.3 max | 6.3 max |

FIG. 9

METHOD FOR ASSEMBLING AN ACTUATOR HEAD SUSPENSION

CROSS-REFERENCES TO RELATED APPLICATIONS

This application claims priority from Japanese Patent Application No. JP2004-051846, filed Feb. 26, 2004, the entire disclosure of which is incorporated herein by reference.

BACKGROUND OF THE INVENTION

The present invention relates to a method for assembling an actuator head suspension assembly that forms part of a magnetic disk device, an optical magnetic disk device, or the like. More particular, the invention relates to a technique for preventing the head suspension assembly from being damaged by electrostatic discharge.

The actuator head suspension assembly used in the magnetic disk device includes an actuator assembly and a head suspension assembly. The head suspension assembly includes a load beam, a hinge, a mount plate, a flexure assembly, and the like. The flexure assembly includes a head/slider including a head and a slider, a flexure for supporting the head/slider, and a lead connected to the head.

The head suspension assembly is mounted on the actuator assembly. Performing a pivotal motion as driven by a voice coil motor, the head suspension assembly can bring the head to a desired track on a magnetic disk surface. The head/slider flies above the magnetic disk surface with an extremely small clearance therefrom by balancing an upward lift received from an air flow of the magnetic disk surface against a pressing load applied thereto by the load beam. The head/slider thereby performs a gimbal motion to follow the track.

Requirements for control characteristics and read/write performance of the head have become even more stringent to respond to the increased data recording density of the magnetic disk in recent years. The current situation is that effects of weight, layout, and the like of leads on the head suspension assembly on head positioning control can no longer be ignored. As a result, a trend now is toward adopting a flexure assembly incorporating integrated wires (hereinafter referred to as an "integrated wire flexure assembly"). The integrated wire flexure assembly reduces variations in gimbal characteristics of the flexure as caused by a wire, which may be bonded to the flexure or a pattern of which may be formed in the flexure. Another trend is toward incorporating a GMR read head that makes use of "giant magnetoresistive" (GMR) effect that allows a sufficiently powerful read output to be obtained even from a feeble magnetic field.

In the integrated wire flexure assembly, a lead connected to the head is constructed as follows. Specifically, the lead is a laminated structure including a metal layer, a first dielectric layer, a conductor layer, and a second dielectric layer. The metal layer and the conductor layer sandwich the first dielectric layer therebetween to form a capacitor structure. The head suspension assembly goes through a cleaning process before being supplied to an assembly process of the actuator head suspension assembly. Static electricity is generated from the cleaning process using ultrapure water and through contact, friction, or the like among different parts in the assembly process of the head suspension assembly. The capacitor structure thereby accumulates an electric charge.

In the assembly process of the actuator head suspension assembly, a soldered connection is made between the lead of the integrated wire flexure assembly and a terminal of a flexible printed circuit board (hereinafter referred to as an "FPC") of the actuator assembly. An FPC lead may be grounded directly or through a resistor. As soon as the soldered connection is made, therefore, the electric charge accumulated in the capacitor structure of the head suspension assembly is quickly discharged, causing a large current to flow through the head. Even if the FPC lead itself is not grounded, a large current could flow the moment an external terminal for connecting the FPC lead to a circuit board of the magnetic disk device contacts a metallic part. The GMR read head that is extremely sensitive, in particular, is highly likely to be damaged by the discharge of even a small amount of static electricity.

If the head is damaged in the assembly process of the actuator head suspension assembly, it becomes necessary to re-manufacture the entire flexure assembly. This could lead to a delay in fabricating processes and an increase in material costs. Static electricity has conventionally been neutralized by installing an ionizer in assembly environment for the actuator head suspension assembly or placing the head suspension assembly on a ground panel.

Japanese Patent Laid-open No. 2000-21157 discloses a static electricity protective device for a read/write head. The protective device provides protection when the read/write head is transported or assembled into a magnetic disk device. During such a time as recited above, the protective device reliably maintains a short-circuited state for a terminal of a read/write element to protect the read/write element from a discharge of an electric charge. The protective device also allows the short-circuit to be easily removed when the read/write head is to be assembled into the magnetic disk device or connected to an external circuit.

BRIEF SUMMARY OF THE INVENTION

Use of the ionizer or the ground panel is effective in neutralizing a surface charge. The ionizer or the ground panel is not, however, good enough to sufficiently neutralize the charge accumulated in the conductor layer that is sandwiched between the dielectric layers. Assuming that a terminal of the read/write element is sort-circuited, there is no charge before the short-circuit. This requires another measure to be taken for the read/write element when the element is recharged after the short-circuit has been removed. Further, a special arrangement for the short-circuit is additionally necessary. Especially with a wire trace covered with a dielectric layer, static electricity is generated by a slight contact of the wire trace with a human body or an object. It is therefore desirable that an effect of charge neutralization be sustained until a sufficient safety is ensured in terms of work processes.

It is therefore a feature of the present invention to provide a method for easily and reliably neutralizing the charge in the assembly process of the actuator head suspension assembly used in the magnetic disk device, optical magnetic disk device, and the like.

An aspect of the present invention is directed to a method for assembling a head suspension assembly having a wire trace of a laminated structure, to remove easily and reliably charge accumulated in a conductor layer sandwiched between dielectric layers through an exposed portion by using a conductive charge neutralizing solvent. A discharge current flowing in static electricity discharge occurring when the exposed portion of the wire trace is immersed in the charge neutralizing solvent can be held below a permissible current for the head by appropriately selecting an electric conductivity of the charge neutralizing solvent. It is further possible to assemble the head suspension assembly, while maintaining the charge neutralizing effect for a period of time until the charge neutralizing solvent evaporates and disappears.

An embodiment of the present invention provides a method for assembling an actuator head suspension assembly. The method includes the following steps. Specifically, the method provides a head suspension assembly. The head suspension assembly includes a wire trace and a head/slider supported by the metal layer. The wire trace includes a laminated structure of a metal layer, a first dielectric layer, a conductor layer, and a second dielectric layer. The conductor layer includes an exposed portion exposed from the second dielectric layer. The method further provides an actuator assembly including an actuator arm and a flexible printed circuit board. The exposed portion of the conductor layer is immersed in a conductive charge neutralizing solvent. The head suspension assembly is attached to the actuator arm. A terminal of the wire trace is connected to a terminal of the flexible printed circuit board.

The wire trace is provided with the lamination of the metal layer, the first dielectric layer, the conductor layer, and the second dielectric layer. The conductor layer is in contact with an external portion only through the exposed portion thereof. The exposed portion may be a terminal of the wire trace connected to an FPC. Alternatively, the exposed portion may even be a connection between the head/slider and the wire trace. Immersing the exposed portion in the conductive charge neutralizing solvent allows charge accumulated in the conductor layer disposed inside the wire trace to be easily and reliably neutralized. If a grounding device is to be attached to the exposed portion, utmost care should be exercised to prevent the exposed portion from being damaged. According to the embodiment of the present invention, however, there is no chance of the exposed portion being damaged at all.

The arrangement that the charge neutralizing solvent is conductive means that the charge neutralizing solvent serves the purpose satisfactorily as long as the solvent is a liquid that allows electricity to pass therethrough. The charge neutralizing solvent may therefore be a solvent having a high insulation resistance. Part of the charge neutralizing solvent sticking to the exposed portion deprives the exposed portion of charge when the part of the solvent evaporates and disappears. If the wire trace terminal is connected to the grounded FPC terminal before the charge neutralizing solvent evaporates and disappears, the following purpose can be achieved. Specifically, a phenomenon causing the wire trace to be recharged can be prevented from occurring for the period of time from the step for immersing the exposed portion in the charge neutralizing solvent to the step for connecting the wire trace terminal to the FPC terminal. Further, as long as an electric connection is established between the exposed portion of the conductor layer and the metal layer through the conductive charge neutralizing solvent, the condition corresponds to the circuit across the exposed portion of the conductor layer and the metal layer being closed by the charge neutralizing solvent. This prevents the wire trace from being charged. If an FPC conductor is grounded, the wire trace terminal and the FPC terminal may be connected before the charge neutralizing solvent evaporates and disappears. This prevents the wire trace from being charged thereafter through the grounding. The head can then be prevented from being damaged by static electricity in the assembly process for the actuator head suspension assembly.

The present invention provides a method for easily and reliably neutralizing charge in the assembly process for the actuator head suspension assembly used in the magnetic disk device, the optical magnetic disk device, and the like.

DETAILED DESCRIPTION OF THE INVENTION

Figure 1:
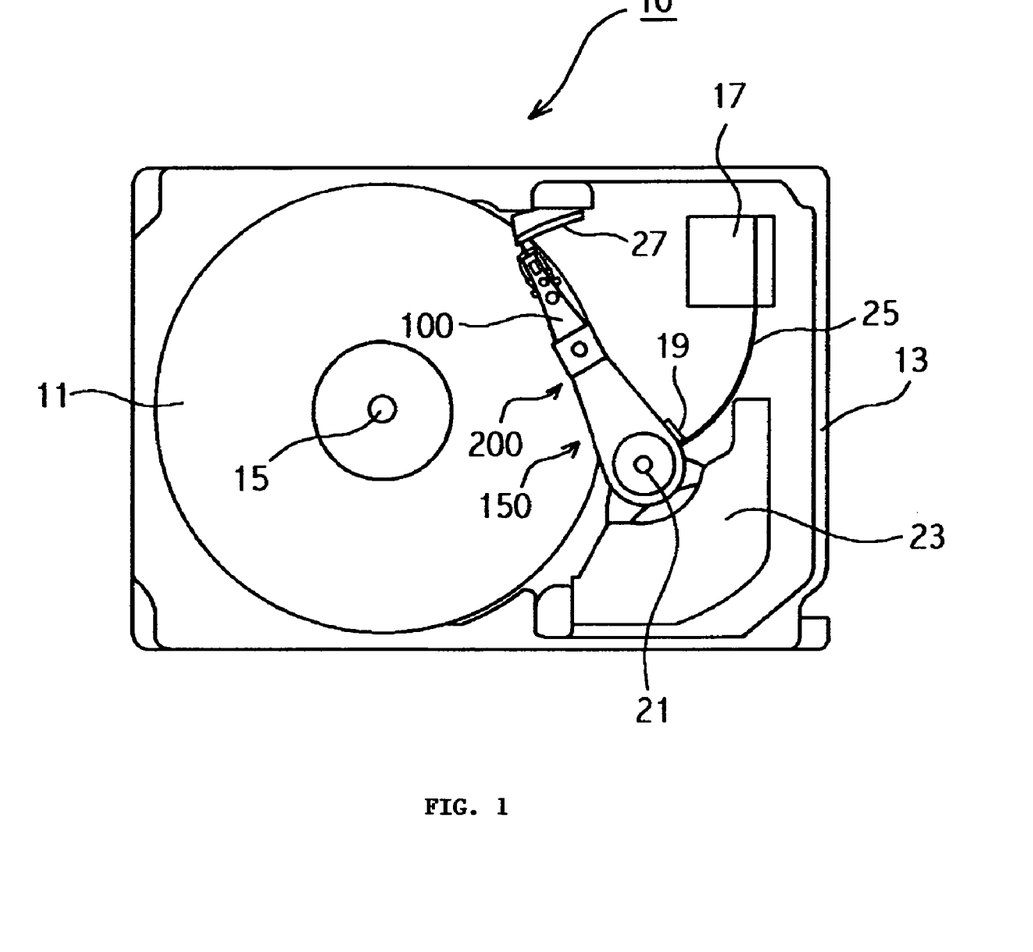
FIG. 1 is a plan view showing the construction of a magnetic disk device that uses an actuator head suspension assembly.

An exemplary embodiment of the present invention will be described with reference to the accompanying drawings. Similar reference numerals have been used throughout the entire specification to denote similar parts. FIG. 1 is a plan view showing the construction of a magnetic disk device 10 that uses an actuator head suspension assembly fabricated through an assembly process in accordance with the exemplary embodiment of the present invention. Parts mounted on a base 13 of the magnetic disk device 10 include the following: specifically, an actuator head suspension assembly 200, a magnetic disk 11, a ramp 27, and the like. The actuator head suspension assembly 200 pivots about a pivot shaft 21. The magnetic disk 11 spins about a spindle shaft 15. The ramp 27 achieves a load/unload type operation. The actuator head suspension assembly 200 includes an actuator assembly 150 and a head suspension assembly 100.

The head suspension assembly 100 is secured to an actuator arm of the actuator assembly 150. The actuator assembly 150 pivots about the pivot shaft 21, as driven by a magnetic field of a voice coil magnet provided on a backside of a yoke 23, and a voice coil motor formed by a voice coil magnet (not shown) held by the actuator assembly 150. A relay terminal portion 19 is provided for the actuator assembly 150. The relay terminal portion 19 is used for connection between a wire trace (not shown) electrically connected to a head and an FPC 25. The FPC 25 has, at a location near the relay terminal portion 19, an IC chip (not shown) that has a built-in element for amplifying signals read by the head. A circuit in the IC chip connected to the head is grounded to the actuator arm directly or by way of a resistor. This IC chip is generally referred to as an AE (arm electronics) or a COS (chip on suspension).

Figure 2:
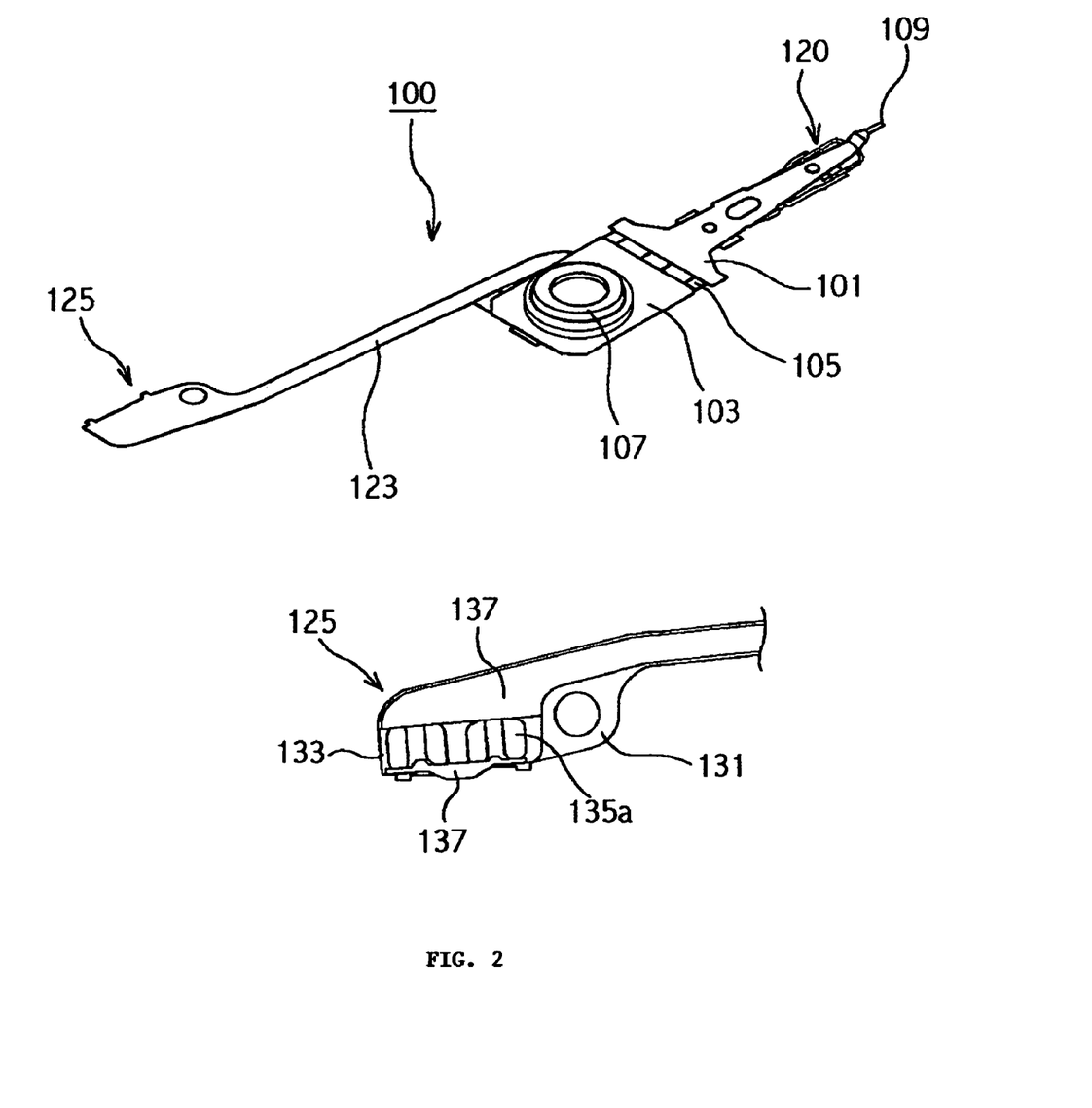
FIG. 2 is a view for explaining the construction of the head suspension assembly according to an embodiment of the present invention.
Figure 3:
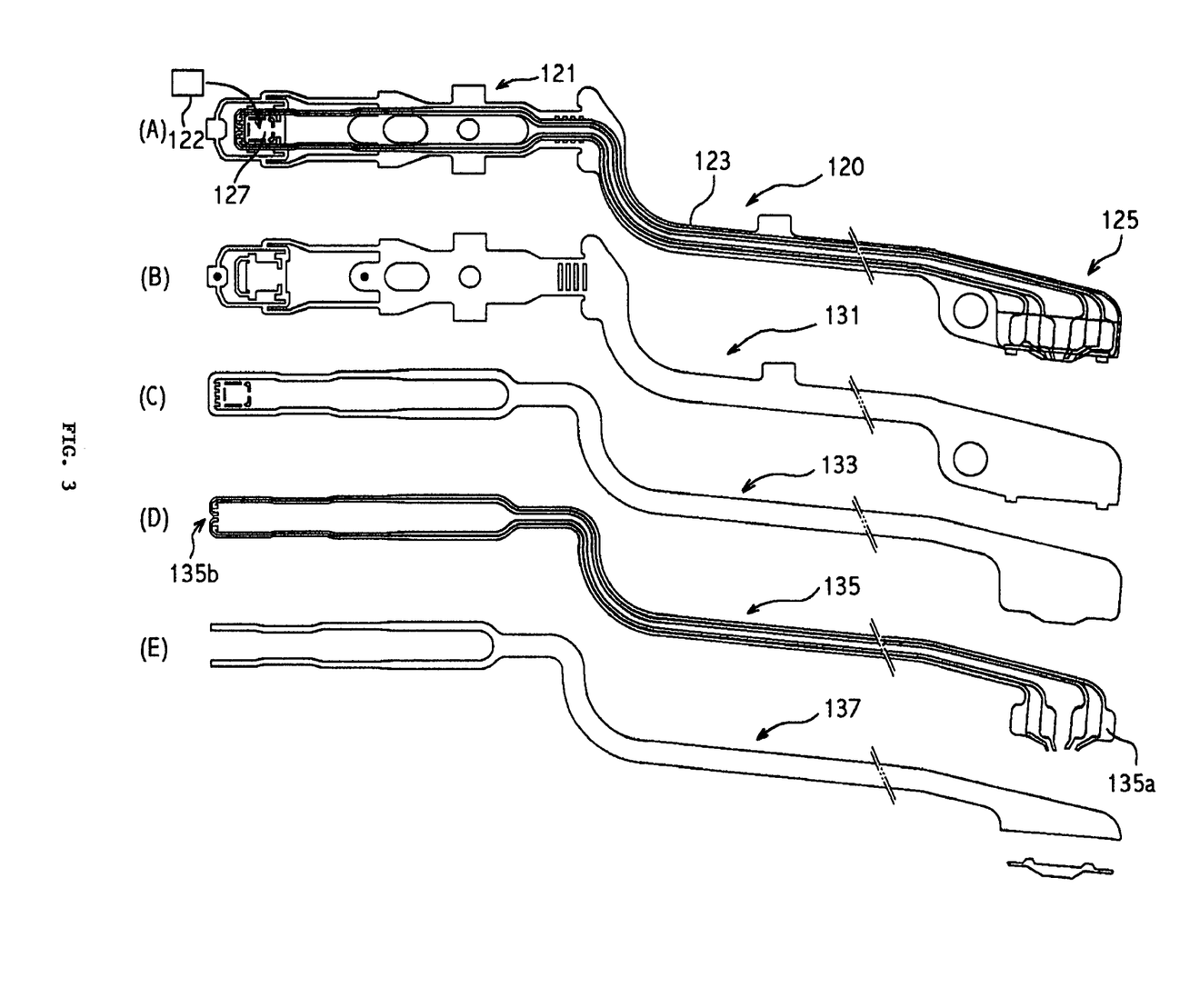
FIGS. 3(A) through 3(E) are views for explaining a laminated structure of an integrated wire flexure assembly according to an embodiment of the present invention.

FIG. 2 is a view showing the construction of the head suspension assembly 100. The head suspension assembly 100 includes load beams 101, 103, a hinge 105, a mount plate 107, and a flexure assembly 120 that is spot-welded to an underside of the load beam 101. There is provided at a leading end of the load beam 101 a merge lip 109 that is engaged with the ramp 27. The flexure assembly 120 is what is called the integrated wire flexure assembly. A conductor layer 135a is exposed at a terminal portion 125 of a wire trace 123. The conductor layer 135a is formed into a wide terminal structure with a dielectric layer 137 removed. In FIG. 2, a dielectric layer 133 and a metal layer 131 are also shown at the terminal portion 125 of the wire trace 123. The construction of these parts will be even more clarified when reference is made to FIG. 3.

FIGS. 3(A) through 3(E) are views showing the construction of the integrated wire flexure assembly 120. Integrated wire flexure assemblies are available in three different types as classified according to the fabrication method employed. The three different types are an additive type, a subtractive type, and a flexible circuit board type. The additive type is fabricated by laminating different layers one on top of another in a required order using a photolithographic technique. The subtractive type is fabricated by etching previously formed sheets of a metal layer, a dielectric layer, a conductor layer, a cover layer, and the like into a predetermined structure. The flexible circuit board type is fabricated by affixing to a metal layer flexible printed circuit boards previously formed into a predetermined shape of a dielectric layer, a conductor layer, and a cover layer. FIG. 3(A) is a view showing the flexure assembly 120 of the additive type, as viewed from the side of the magnetic disk 11. The flexure assembly 120 includes a head/slider 122, a flexure 121 performing a gimbal motion, and the wire trace 123. The flexure 121 includes a flexure tongue 127. The head/slider 122 is secured to the flexure tongue 127. The present invention is effective for any type of the flexure assembly.

FIGS. 3(B) through 3(E) are shown in the order of laminating the different layers toward the magnetic disk 11. FIG. 3(B) is a view showing an outline of the metal layer 131 that serves as a structural body of the flexure assembly. Stainless steel, beryllium, titanium, copper, or the like with a thickness of about 20 □m is used for the metal layer 131. The dielectric layer 133 formed into a shape as shown in FIG. 3(C) is laminated on the metal layer 131. A polyimide with a thickness of about 10 mm is laminated as the dielectric layer 133. A conductor layer 135 formed into a shape as shown in FIG. 3(D) is laminated on the dielectric layer 133. The conductor layer 135 is connected to the FPC 25 by means of an exposed portion 135a and to a bonding pad of the head/slider 122 by means of an exposed portion 135b. A pure copper with an approximate thickness of 10 mm is laminated as the conductor layer 135. The dielectric layer 137 formed into a shape as shown in FIG. 3(E) is laminated further on the conductor layer 135. The dielectric layer 137 functions as a cover layer that protects the conductor layer 135. The dielectric layer 137 is a polyimide with a thickness of about 3 mm.

The metal layer 131 and the dielectric layer 137 are situated on surfaces of the flexure assembly 120. Only the exposed portions 135a and 135b face the outside. The metal layer 131 and the conductor layer 135 sandwich the dielectric layer 133 therebetween to form a capacitor structure. If the dielectric layer 137 contacts an object or generates friction, it easily generates static electricity and charge is accumulated in the conductor layer 135. To neutralize charge from the conductor layer 135, on the other hand, it can be understood that an ionizer or a ground plate is not effective enough to sufficiently neutralize the charge. This is because portions other than the exposed portions 135a and 135b are insulated by the dielectric layers 133 and 135.

The trend in the type of a read head forming part of the head/slider 122 is toward the use of an MR read head that makes use of magnetoresistive effect. This represents a need for an increased read sensitivity to respond to the increased data recording density of the magnetic disk. In the MR read head, a bias current is made to flow through a magnetoresistive effect element. A change in a signal magnetic field from the magnetic disk is thereby translated to a corresponding value of a voltage change for reproduction. MR film that converts the change in the signal magnetic field to a corresponding change in voltage is so thin that the film tends to develop electrostatic destruction. The same holds true with a GMR read head that makes use of giant magnetoresistive (GMR) effect. Scrupulous care is therefore exercised about electrostatic destruction when transporting and handling the head suspension assembly mounted with the GMR read head. It is, however, not easy at all to neutralize the capacitor structure formed internally as described in the foregoing. If the conductor layer 135 is suddenly grounded through a path of some form, a large current could flow through the GMR read head, resulting in the read head being destroyed.

Figure 4:
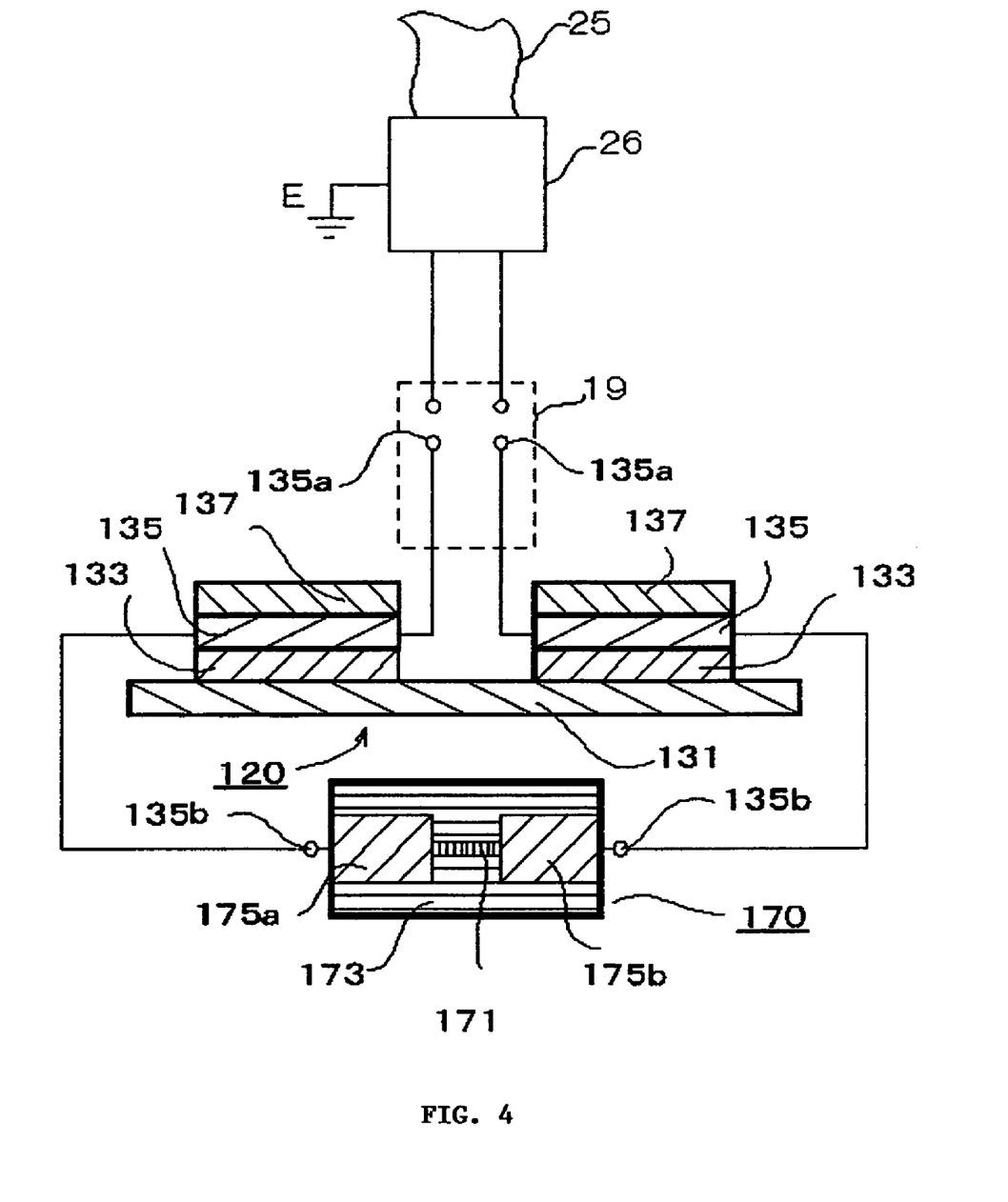
FIG. 4 is a view for explaining a condition, in which a GMR read head is destroyed by static electricity.

FIG. 4 is an explanatory view depicting a condition, in which a GMR read head 170 is destroyed by static electricity. The head/slider 122 includes the GMR read head 170, in addition to a magnetic write head. The GMR read head 170 includes lead films 175a, 175b, and a shield film 173 that shuts off an unwanted magnetic field. FIG. 4 further shows the capacitor structure including the dielectric layer 133 sandwiched between the conductor layer 135 and the metal layer 131.

If the dielectric layer 137 is charged by friction or the like, charge is also accumulated in the conductor layer 135. When the conductor layer 135 and the GMR read head 170 are connected through the exposed portion 135b of the conductor layer 135, no electrostatic discharge occurs, since the exposed portion 135a is open. The following, however, occurs, if the exposed portion 135b is connected to the bonding pad connected to the GMR read head 170 and then the conductor layer 135 is connected to the terminal of the FPC 25 through the exposed portion 135a. Specifically, the charge accumulated in the conductor layer 135 is discharged instantaneously toward a ground E, because the circuit in an IC chip 26 mounted on the FPC 25 is grounded to the ground E. At this time, the discharge current can pass through the GMR film 171, causing electrostatic destruction. There is also the following possibility, even if the IC chip 26 is not grounded. Specifically, a vulnerable portion of the dielectric layer 137 or an external terminal 17 connected to the FPC 25 contacts a metal or the like to discharge, thus damaging the GMR read head 170.

For the reasons mentioned above, an antistatic measure or a charge neutralizing measure becomes necessary for the head suspension assembly 100. Charge neutralizing measures, in particular, should go in a direction of reducing static buildup, in which longer time is spent in discharging. This is because a large current flows through the GMR read head 170 if the accumulated charge is discharged instantaneously. As a commonly used method for reducing static buildup, a charged portion is grounded through a high resistance. This is, however, not a satisfactorily effective approach toward neutralizing charge when, as in the head suspension assembly, static electricity damaging the head is produced by an instantaneous contact or friction with an object.

Figure 5:
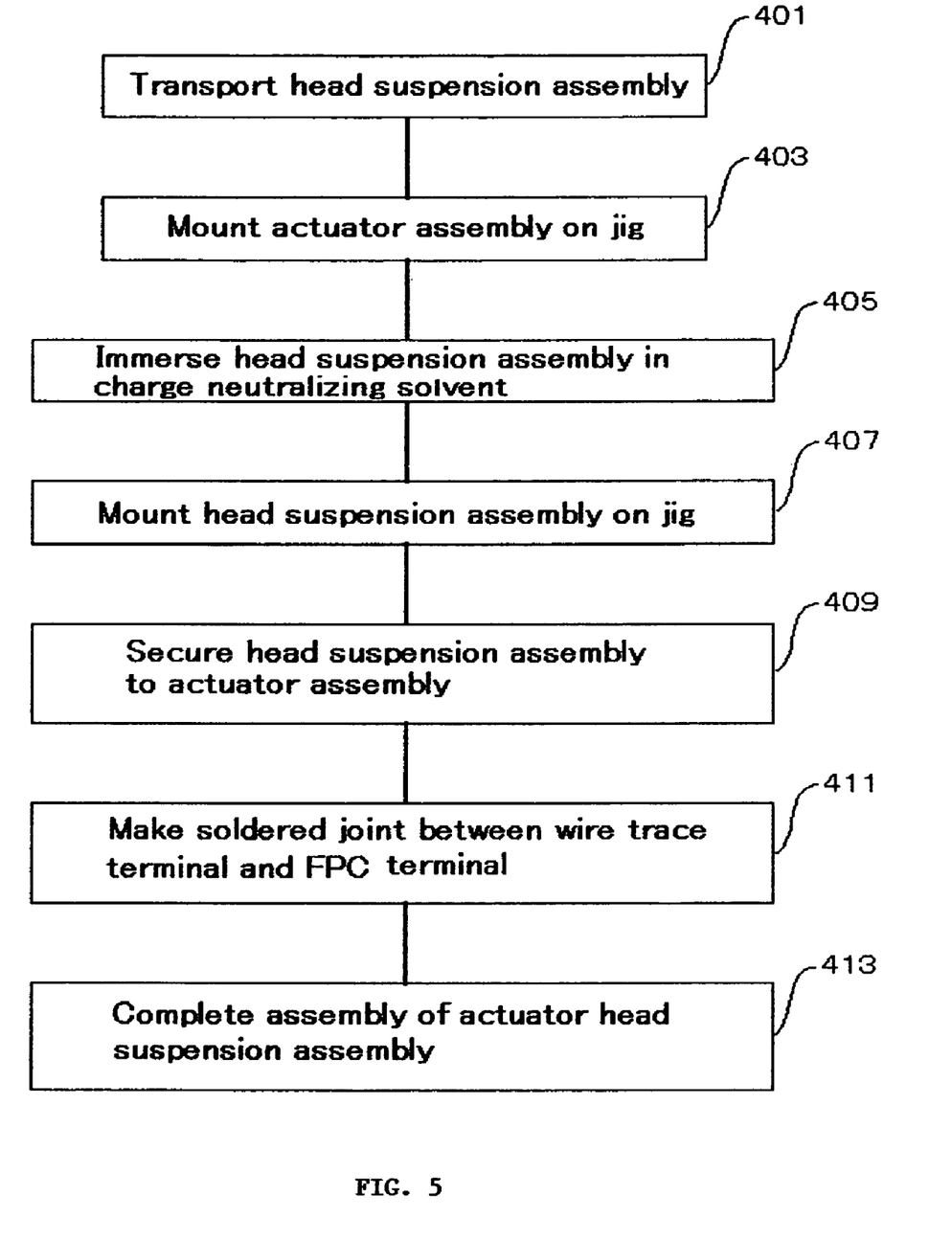
FIG. 5 is a flowchart showing steps for assembling the actuator head suspension assembly according to an embodiment of the present invention.
Figure 6:
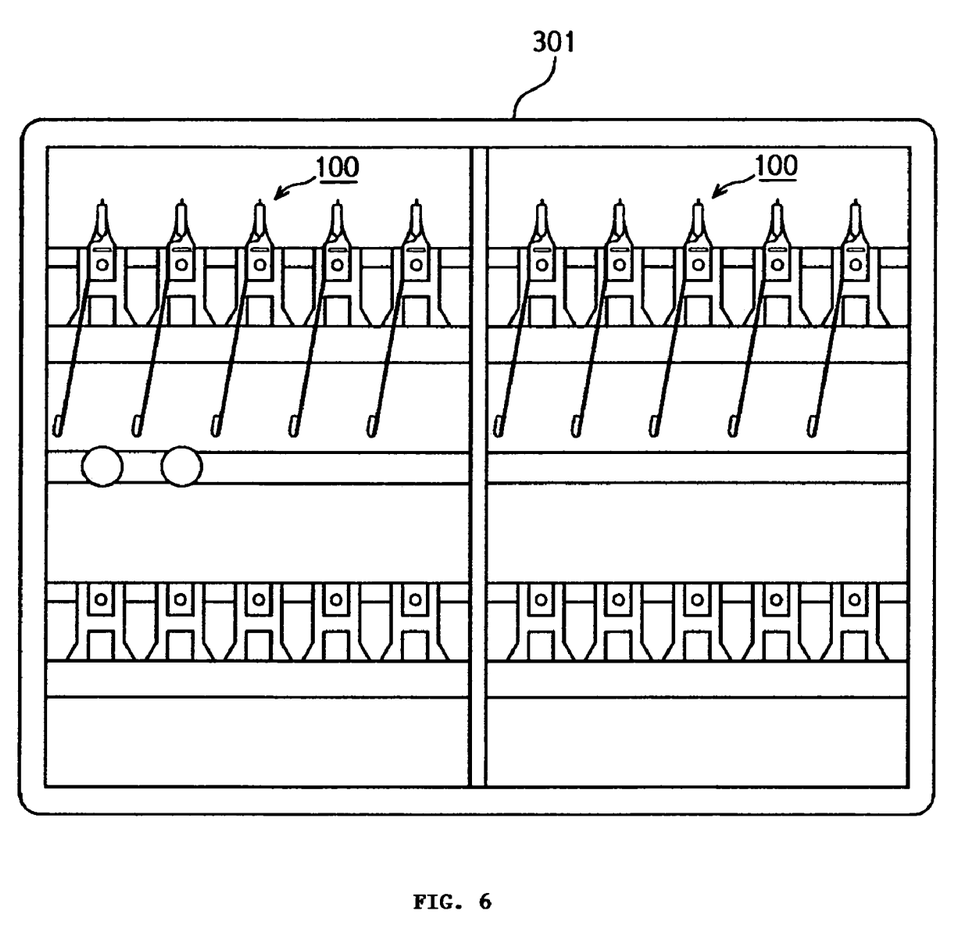
FIG. 6 is a view for explaining the head suspension assembly accommodated in a transport tray according to an embodiment of the present invention.
Figure 7:
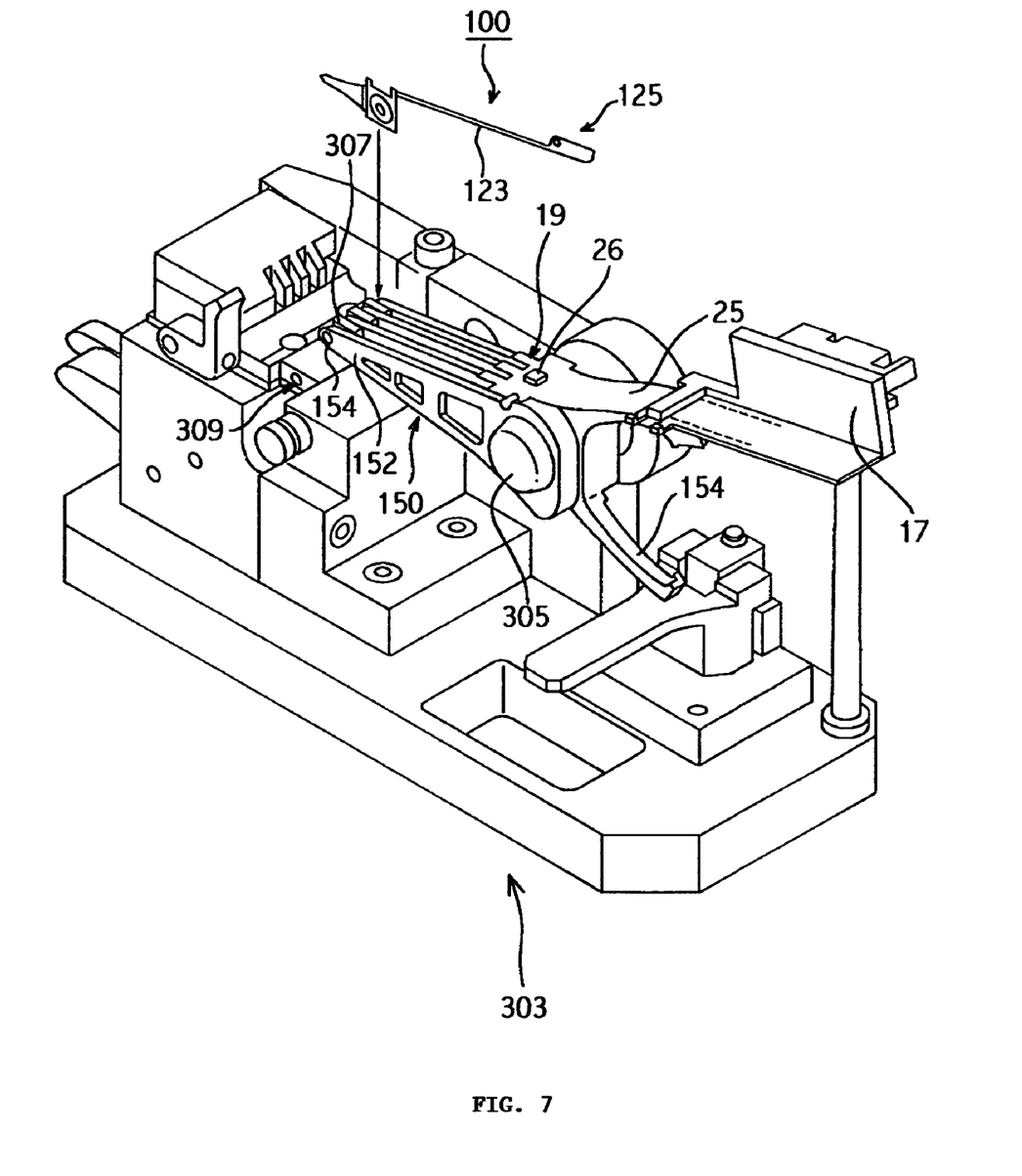
FIG. 7 is a view for explaining assembly of the actuator head suspension assembly using an assembly jig according to an embodiment of the present invention.
Figure 8:
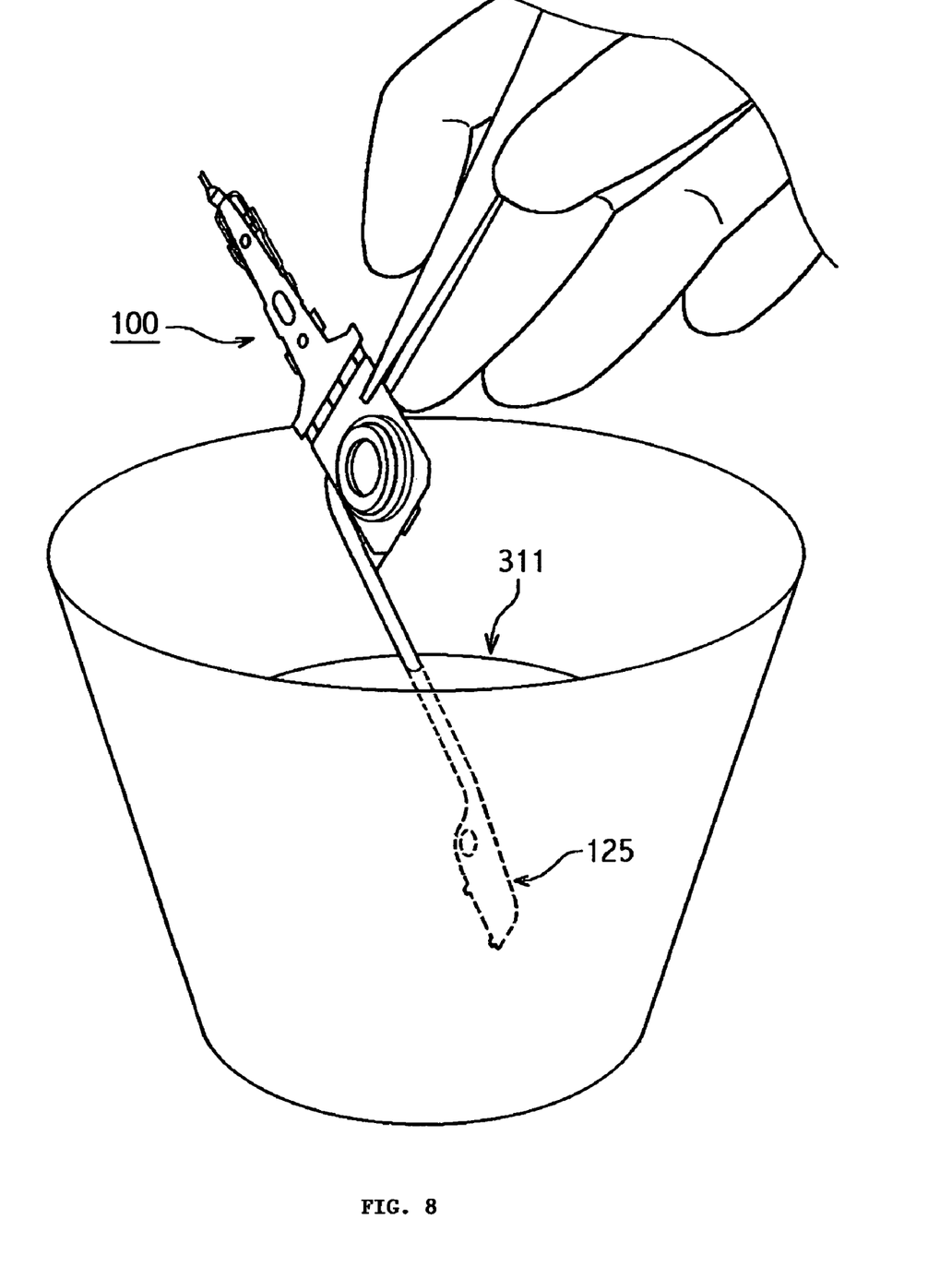
FIG. 8 is a view for explaining a condition, in which the head suspension assembly is soaked in a charge neutralizing solvent according to an embodiment of the present invention.

The assembly procedures for the actuator head suspension assembly in accordance with the exemplary embodiment of the present invention will be described with reference to FIGS. 5 through 8. Reference is also made to figures other than FIGS. 5 through 8 for similar parts having similar reference numerals. FIG. 5 is a flowchart showing steps for assembling the actuator head suspension assembly 200. FIG. 6 is a view for explaining the head suspension assembly 100 accommodated in a transport tray. FIG. 7 is a view for explaining assembly of the actuator head suspension assembly 200 using an assembly jig 303. FIG. 8 is a view for explaining a condition, in which the head suspension assembly 100 is soaked in the charge neutralizing solvent. The parts used for assembling the actuator head suspension assembly 200 are cleaned in ultrapure water before being transported into a clean room. The assembly procedures are carried out in clean air environment of the clean room.

In block 401, the head suspension assembly 100 is transported to an assembly site. Referring to FIG. 6, head suspension assemblies 100 are neatly accommodated in a conductive transport tray 301 made of polycarbonate. The transport tray 301, which is to be placed on a conductive plate, is designed to neutralize charged surfaces of the head suspension assembly 100. The charge accumulated in the conductor layer 135 of the wire trace 123 cannot, however, be neutralized through the surfaces of the head suspension assembly 100 that is covered with the dielectric layer 137. In the head suspension assemblies 100 accommodated in the transport tray 301, therefore, the conductor layer 135 can be charged during the cleaning process and/or the transport process. Further, the head suspension assemblies 100 can even be charged through handling in subsequent processes.

In block 403, the actuator assembly 150 is mounted on the assembly jig 303. Block 403 may be performed before block 401. The actuator assembly 150 includes a coil support 154 and an actuator arm 152. The actuator assembly 150 is retained by inserting a fixing shaft 305 into a pivot opening. Though not shown in FIG. 7, a voice coil is previously mounted on the coil support 154. Four actuator arms 152 are laminated together. Two head suspension assemblies 100 each are attached to a front surface and a back surface of each of these actuator arms 152.

The FPC 25 is mounted on the actuator assembly 150. The external terminal 17 and the IC chip 26 are mounted on the FPC 25. The circuit of the IC chip 26 is grounded to the actuator arm 152 made of aluminum. In FIG. 7, a wire support member not shown is provided on an upward facing end portion of the actuator arms 152. The wire trace 123 is secured to the wire support member after the head suspension assembly 100 has been mounted to the actuator assembly 150.

In block 405, the side of the terminal portion 125 of the wire trace 123 of the head suspension assembly 100 is immersed in a conductive charge neutralizing solvent 311. This procedure is illustrated in FIG. 8. The exposed portion 135a of the conductor layer 135 is exposed from the dielectric layer 137 at the terminal portion 125 of the wire trace 123. Immersing the terminal portion 125 of the wire trace 123 in the charge neutralizing solvent 311, the conductor layer 135 and the metal layer 133 are short-circuited. This neutralizes the charge. In addition, the charge in the dielectric layer 137 can also be neutralized through a surface thereof in contact with the charge neutralizing solvent 311.

About half of the entire length of a portion of the wire trace 123 separated from the load beam 103 is immersed in the charge neutralizing solvent 311. Only several seconds should be sufficient to keep the wire trace 123 immersed in the charge neutralizing solvent 311. Instead of the side of the terminal portion 125 of the wire trace 123, the exposed portion 135b on the side of the head/slider 122 may be immersed in the charge neutralizing solvent 311. This is because the bonding pad of the head/slider 122 and the exposed portion 135b of the conductor layer are exposed from the dielectric layers 133, 137. The immersion method as shown in FIG. 8, however, results in relatively poor workability.

The charge neutralizing solvent 311 must be, in the first place, conductive, since it neutralizes charge by making conductive the metal layer 131 and the conductor layer 135. In the second place, the charge neutralizing solvent 311 preferably has a relatively low conductivity, since the solvent suppresses discharge current through static buildup reduction. The conductivity can be established according to the resistance of the head suspension assembly 100 to static electricity. An excessively low conductivity of the charge neutralizing solvent is not preferable, since the excessively low conductivity results in immersion time becoming long. In the third place, it is desirable that the charge neutralizing solvent sticking to the wire trace 123 after the immersion does not evaporate to disappear for a period of time extending at least about 10 to 30 seconds. The period of time through which the charge neutralizing solvent sticks to the wire trace 123 without evaporating can prevent the head suspension assembly 100 from being charged by any cause of generating static electricity thereafter occurring. It is therefore desirable that the charge neutralizing solvent does not evaporate to disappear at room temperature for the period of time from about 10 to 30 seconds. This period of time is necessary for the processes from block 405 to block 413.

Figure 9:
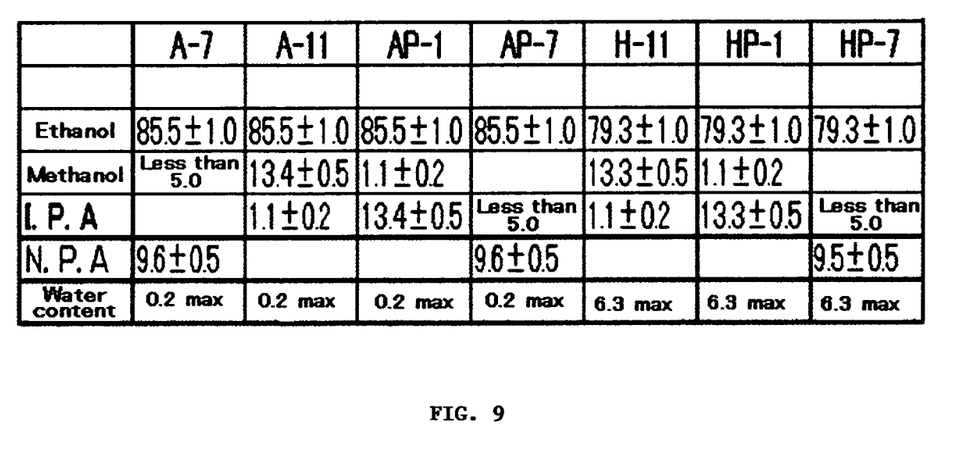
FIG. 9 is a table listing components of SOLMIX.

A type of the charge neutralizing solvent should preferably be selected that evaporates to disappear after the lapse of a predetermined period of time. This property of the charge neutralizing solvent would not adversely affect the subsequent processes. In the fourth place, it is preferable that the charge neutralizing solvent not corrode the dielectric layer 137, the conductor layer 135, or the metal layer 131. The charge neutralizing solvent is preferably not harmful to humans, either. For the charge neutralizing solvent, a mixed solvent having ethanol as the major component may be selected. A mixed liquid such as this one is available from Japan Alcohol Trading Co., Ltd. as SOLMIX (a registered trademark of Japan Alcohol Trading Co., Ltd.). FIG. 9 is a table listing components of some of products marketed under the trademark of SOLMIX. A-7 through HP-1 are product names. SOLMIX contains methanol, isopropyl alcohol (I.P.A.), normal propanol (N.P.A.), water, and the like, with ethanol as the major component.

The charge neutralizing solvent may even be a solvent containing any one of methanol, ethanol, isopropyl alcohol, normal propanol, methyl ethyl ketone (MEK), methyl isobutyl ketone (MIBK), and the like. The charge neutralizing solvent may even be a mixed solvent containing any two or more of the aforementioned components. In addition to the aforementioned, a type of charge neutralizing solvent may serve the purpose as long as the type is a polar solvent having polarity overall. The polar solvent is a type of liquid having positive and negative charges deviated from each other through dipole polarization.

In block 407, the head suspension assembly 100 is mounted on the assembly jig 303. Referring to FIG. 7, the actuator assembly 150 has previously been secured to the assembly jig 303. The head suspension assembly 100 is mounted to the assembly jig 303 so that the mount plate 107 of the head suspension assembly 100 is aligned with a swage hole 154 of the actuator arm 152. The actuator arms 152 are laminated with a gap allowed between each pair thereof. A total of eight head suspension assemblies 100 are to be mounted so that each is aligned with both surfaces of each actuator arm 152. A spacer 307 is assembled to the assembly jig 303. The spacer 307 allows the mount plate 107 of the head suspension assembly 100 laminated to the actuator arm 152 to be pressed up against the front surface of the actuator arm 152.

Before the head suspension assembly 100 is mounted on the assembly jig 303, the spacer 307 is lowered. This allows the head suspension assembly 100 to be installed in a space between the actuator arms 152. After the head suspension assembly 100 has been mounted on the assembly jig 303, the spacer 307 is raised and the head suspension assembly 100 is pressed against the actuator arm 152 so that a boss of the mount plate 107 fits into the swage hole 154 in the actuator arm 152.

In block 409, the head suspension assembly 100 is secured to the actuator arm 152. By way of a swage ball loading port 309 in the assembly jig 303, a metal ball having a diameter slightly larger than a through hole in the mount plate 107 is pushed through the swage hole 154 of the actuator arm 152, a through hole in the spacer 307, and the through hole in the mount plate 107. This allows the mount plate 107 to be swaged and secured in the swage hole 154.

The wire trace 123 is then secured to the wire support member not shown. In block 411, the exposed portion 135a of the conductor layer of the wire trace 123 is joined to the terminal of the FPC 25 through soldering. From block 405 to block 411, the charge neutralizing solvent 311 is left sticking to the terminal portion 125 or the like of the wire trace 123 without evaporating to completely disappear. Assume that the head suspension assembly 100 runs into a condition of being charged due to friction or contact with an object for the processes of up to block 411, despite the fact that charge has been completely neutralized in block 405. Even if this happens, the amount of charge can be held within a relatively small value for the following reasons. Specifically, for one, the metal layer 131 and the conductor layer 135 are electrically conductive through the charge neutralizing solvent. For another, the charge neutralizing solvent takes away charge from the wire trace 123 as the solvent evaporates.

Referring to FIG. 8, an operator uses a pair of tweezers to hold the head suspension assembly 100 and mounts the head suspension assembly 100 in the assembly jig 303. Then, the operator completes making a soldered joint between the exposed portion 135a of the conductor layer and the terminal of the FPC 25. During this period, there are involved various factors contributing to accumulation of so large an amount of charge as to damage the head. Use of the charge neutralizing solvent is effective for that matter. The charge neutralizing solvent thereafter evaporates to disappear, not affecting the subsequent processes at all.

When the soldered joint is made between the exposed portion 135a of the conductor layer 135 of the wire trace 123 and the terminal of the FPC 25, the conductor layer 135 is grounded to the actuator arm 152 through the IC chip 26. Charge can therefore be neutralized in the subsequent processes by grounding the actuator arm 152 using the ground plate or the like. In block 413, the assembly of the actuator head suspension assembly 200 is completed and the assembly is removed from the assembly jig 303. An operation test carried out in a subsequent process revealed that there was a drop in defect ratio by as much as 35% when the assembly processes were compared between before and after the adoption of the charge neutralizing process using the charge neutralizing solvent. This represents a reduction in ratio of the head developing electrostatic destruction. One embodiment of the present invention has been described by using manual assembly processes of the actuator head suspension assembly. It goes without saying that the invention can be achieved using automated assembly processes.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims alone with their full scope of equivalents.

What is claimed is:

1. A method for assembling an actuator head suspension assembly, comprising:
   providing a head suspension assembly comprising a wire trace and a head/slider; the wire trace including a laminated structure of a metal layer, a first dielectric layer, a conductor layer, and a second dielectric layer; the conductor layer including an exposed portion exposed from the second dielectric layer; the head/slider being supported by the metal layer;
   providing an actuator assembly including an actuator arm and a flexible printed circuit board;
   immersing the exposed portion of the conductor layer in a conductive charge neutralizing solvent;
   attaching the head suspension assembly to the actuator arm; and
   connecting a terminal of the wire trace to a terminal of the flexible printed circuit board.

2. The method for assembling the actuator head suspension assembly according to claim 1, wherein the conductive charge neutralizing solvent sticking to the head suspension assembly does not disappear through evaporation at room temperature for a period of about 10 seconds to 30 seconds during the step of immersing the exposed portion of the conductor layer in the conductive charge neutralizing solvent.

3. The method for assembling the actuator head suspension assembly according to claim 1, wherein the exposed portion of the conductor layer is the terminal of the wire trace connected to the flexible printed circuit board.

4. The method for assembling the actuator head suspension assembly according to claim 1, wherein the exposed portion of the conductor layer is a connection portion between the head/slider and the wire trace.

5. The method for assembling the actuator head suspension assembly according to claim 1, wherein a conductor of the flexible printed circuit board is grounded to the actuator assembly.

6. The method for assembling the actuator head suspension assembly according to claim 5, wherein connecting the terminal of the wire trace to the terminal of the flexible printed circuit board includes establishing the connection before the charge neutralizing solvent disappears through evaporation.

7. The method for assembling the actuator head suspension assembly according to claim 1, wherein the charge neutralizing solvent is a mixed solvent having ethanol as a major component thereof.

8. The method for assembling the actuator head suspension assembly according to claim 7, wherein the mixed solvent includes methanol.

9. The method for assembling the actuator head suspension assembly according to claim 7, wherein the mixed solvent includes isopropyl alcohol.

10. The method for assembling the actuator head suspension assembly according to claim 7, wherein the mixed solvent includes normal propanol.

11. The method for assembling the actuator head suspension assembly according to claim 1, wherein the mixed solvent is a mixed solvent formed by any element selected from among a group comprising methanol, ethanol, isopropyl alcohol, normal propanol, methyl ethyl ketone, and methyl isobutyl ketone, or a mixed solvent including any two or more of the elements.

12. The method for assembling the actuator head suspension assembly according to claim 1, wherein the mixed solvent is a polar solvent.

13. The method for assembling the actuator head suspension assembly according to claim 1, wherein the head includes a GMR read head.

14. The method for assembling the actuator head suspension assembly according to claim 1, wherein the terminal of the wire trace is connected to the terminal of the flexible printed circuit board by a soldered joint.

15. The method for assembling the actuator head suspension assembly according to claim 14, further comprising, when the soldered joint is made between the terminal of the wire trace and the terminal of the flexible printed circuit board, grounding the conductive layer of the wire trace of the head suspension assembly to the actuator arm.

16. The method for assembling the actuator head suspension assembly according to claim 15, wherein the conductive layer of the head suspension assembly is grounded to the actuator arm through an IC chip mounted on the flexible printed circuit board.

17. A method for assembling an actuator head suspension assembly, comprising:

providing a head suspension assembly comprising a wire trace and a head/slider; the wire trace including a laminated structure of a metal layer, a first dielectric layer, a conductor layer, and a second dielectric layer; the conductor layer including an exposed portion exposed from the second dielectric layer; the head/slider being supported by the metal layer;

providing an actuator assembly including an actuator arm and a flexible printed circuit board;

immersing the exposed portion of the conductor layer in a conductive charge neutralizing solvent;

attaching the head suspension assembly to the actuator arm; and connecting the exposed portion of the conductive layer of the wire trace of the head suspension assembly to a terminal of the flexible printed circuit board.

18. The method for assembling the actuator head suspension assembly according to claim 17, wherein the conductive charge neutralizing solvent sticking to the head suspension assembly does not disappear through evaporation at room temperature for a period of 10 seconds to 30 seconds during the step of immersing the exposed portion of the conductor layer in the conductive charge neutralizing solvent.

19. The method for assembling the actuator head suspension assembly according to claim 17, wherein the exposed portion of the conductive layer of the wire trace of the head suspension assembly is connected to the terminal of the flexible printed circuit board by a soldered joint.

20. The method for assembling the actuator head suspension assembly according to claim 19, further comprising, when the soldered joint is made between the exposed portion of the conductive layer of the wire trace of the head suspension assembly and the terminal of the flexible printed circuit board, grounding the conductive layer of the wire trace to the actuator arm.

* * * * *